US012635578B2

(12) United States Patent
Wang et al.

(10) Patent No.: US 12,635,578 B2
(45) Date of Patent: May 19, 2026

(54) DISPLAY PANEL AND DISPLAY SCREEN WITH A LIGHT-EMITTING ASSEMBLY AND A LIGHT-FILTERING ASSEMBLY

(71) Applicants: CHUZHOU HKC OPTOELECTRONICS TECHNOLOGY CO., LTD., Chuzhou City (CN); HKC CORPORATION LIMITED, Shenzhen (CN)

(72) Inventors: Guangjia Wang, Chuzhou City (CN); Haijiang Yuan, Chuzhou City (CN)

(73) Assignees: CHUZHOU HKC OPTOELECTRONICS TECHNOLOGY CO., LTD., Chuzhou City (CN); HKC CORPORATION LIMITED, Shenzhen (CN)

( * ) Notice: Subject to any disclaimer, the term of this patent is extended or adjusted under 35 U.S.C. 154(b) by 582 days.

(21) Appl. No.: 18/083,845

(22) Filed: Dec. 19, 2022

(65) Prior Publication Data

US 2023/0402440 A1      Dec. 14, 2023

(30) Foreign Application Priority Data

Jun. 8, 2022    (CN) .......................... 202210642543.8

(51) Int. Cl.
*H10W 90/00*        (2026.01)
*H10H 20/01*        (2025.01)
        (Continued)

(52) U.S. Cl.
CPC .......... *H10W 90/00* (2026.01); *H10H 20/857* (2025.01); *H10H 20/0364* (2025.01);
        (Continued)

(58) Field of Classification Search
CPC ......... H01L 24/13; H01L 24/29; H01L 24/32; H01L 25/167; H01L 25/0753;
        (Continued)

(56) References Cited

U.S. PATENT DOCUMENTS

2009/0015130 A1    1/2009  Kim et al.
2009/0033205 A1    2/2009  Lee
        (Continued)

FOREIGN PATENT DOCUMENTS

CN        103022051 A      4/2013
CN        109037270 A      12/2018
        (Continued)

OTHER PUBLICATIONS

The first office action issued in corresponding CN application No. 202210642543.8 dated Feb. 3, 2023.
        (Continued)

*Primary Examiner* — Wael M Fahmy
*Assistant Examiner* — Tiberiu Dan Onuta
(74) *Attorney, Agent, or Firm* — HAUPTMAN HAM, LLP

(57)        ABSTRACT

A display panel, a display screen, and a manufacturing method of a display screen are provided. The display panel includes a light-emitting assembly, a driving assembly, multiple first conductive members, and multiple second conductive members. The light-emitting assembly includes multiple light-emitting units, where each of the multiple light-emitting units includes a first electrode and a second electrode spaced apart from the first electrode, and the first electrode surrounds the second electrode. The driving assembly includes multiple driving units, where one of the multiple driving units is disposed in correspondence with one of the multiple light-emitting units, and different driving units correspond to different light-emitting units. Each of the
        (Continued)

multiple driving units includes a third electrode and a fourth electrode spaced apart from the third electrode, and the third electrode surrounds the fourth electrode. Each of the multiple first conductive members couples the first electrode with the third electrode.

14 Claims, 6 Drawing Sheets

(51) Int. Cl.
| | |
|---|---|
| *H10H 20/857* | (2025.01) |
| *H10W 72/20* | (2026.01) |
| *H10W 72/30* | (2026.01) |

(52) U.S. Cl.
CPC ........ *H10W 72/242* (2026.01); *H10W 72/252* (2026.01); *H10W 72/352* (2026.01); *H10W 72/353* (2026.01); *H10W 72/354* (2026.01); *H10W 90/732* (2026.01)

(58) Field of Classification Search
CPC . H01L 2224/13021; H01L 2224/13139; H01L 2224/13144; H01L 2224/13147; H01L 2224/29118; H01L 2224/29124; H01L 2224/29139; H01L 2224/29144; H01L 2224/29147; H01L 2224/29155; H01L 2224/2916; H01L 2224/2919; H01L 2224/29193; H01L 2224/32145; H10H 20/857; H10H 20/0364; H10H 20/855

See application file for complete search history.

(56) References Cited

U.S. PATENT DOCUMENTS

| | | | | |
|---|---|---|---|---|
| 2012/0138984 A1* | 6/2012 | Kamiya | ............... | H10H 20/831 |
| | | | | 257/E33.068 |
| 2017/0133550 A1* | 5/2017 | Schuele | ................ | H01L 25/167 |
| 2021/0313493 A1* | 10/2021 | Yeh | ........................ | H10H 20/85 |

FOREIGN PATENT DOCUMENTS

| | | | | | |
|---|---|---|---|---|---|
| CN | 111312744 | A | 6/2020 | | |
| CN | 111430342 | A | 7/2020 | | |
| CN | 212136469 | U | 12/2020 | | |
| CN | 215184043 | * | 12/2021 | ........... | H01L 25/075 |
| CN | 215184043 | U | 12/2021 | | |
| CN | 215933606 | U | 3/2022 | | |
| JP | 2004342881 | A | 12/2004 | | |

OTHER PUBLICATIONS

WIPO, International Search Report and Written Opinion for International Application No. PCT/CN2022/118208, Jan. 18, 2023.

* cited by examiner

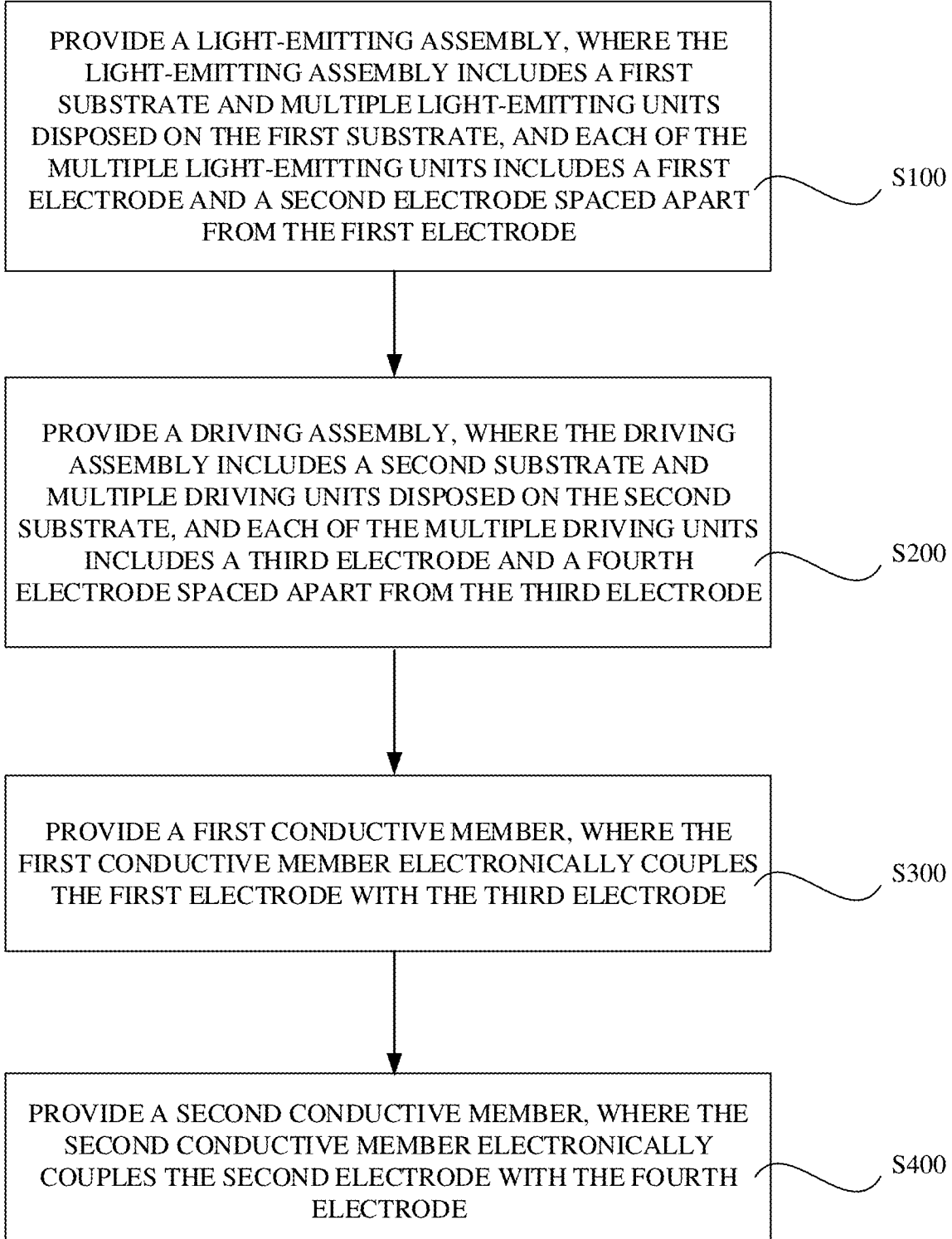

PROVIDE A LIGHT-EMITTING ASSEMBLY, WHERE THE LIGHT-EMITTING ASSEMBLY INCLUDES A FIRST SUBSTRATE AND MULTIPLE LIGHT-EMITTING UNITS DISPOSED ON THE FIRST SUBSTRATE, AND EACH OF THE MULTIPLE LIGHT-EMITTING UNITS INCLUDES A FIRST ELECTRODE AND A SECOND ELECTRODE SPACED APART FROM THE FIRST ELECTRODE — S100

PROVIDE A DRIVING ASSEMBLY, WHERE THE DRIVING ASSEMBLY INCLUDES A SECOND SUBSTRATE AND MULTIPLE DRIVING UNITS DISPOSED ON THE SECOND SUBSTRATE, AND EACH OF THE MULTIPLE DRIVING UNITS INCLUDES A THIRD ELECTRODE AND A FOURTH ELECTRODE SPACED APART FROM THE THIRD ELECTRODE — S200

PROVIDE A FIRST CONDUCTIVE MEMBER, WHERE THE FIRST CONDUCTIVE MEMBER ELECTRONICALLY COUPLES THE FIRST ELECTRODE WITH THE THIRD ELECTRODE — S300

PROVIDE A SECOND CONDUCTIVE MEMBER, WHERE THE SECOND CONDUCTIVE MEMBER ELECTRONICALLY COUPLES THE SECOND ELECTRODE WITH THE FOURTH ELECTRODE — S400

FIG. 11

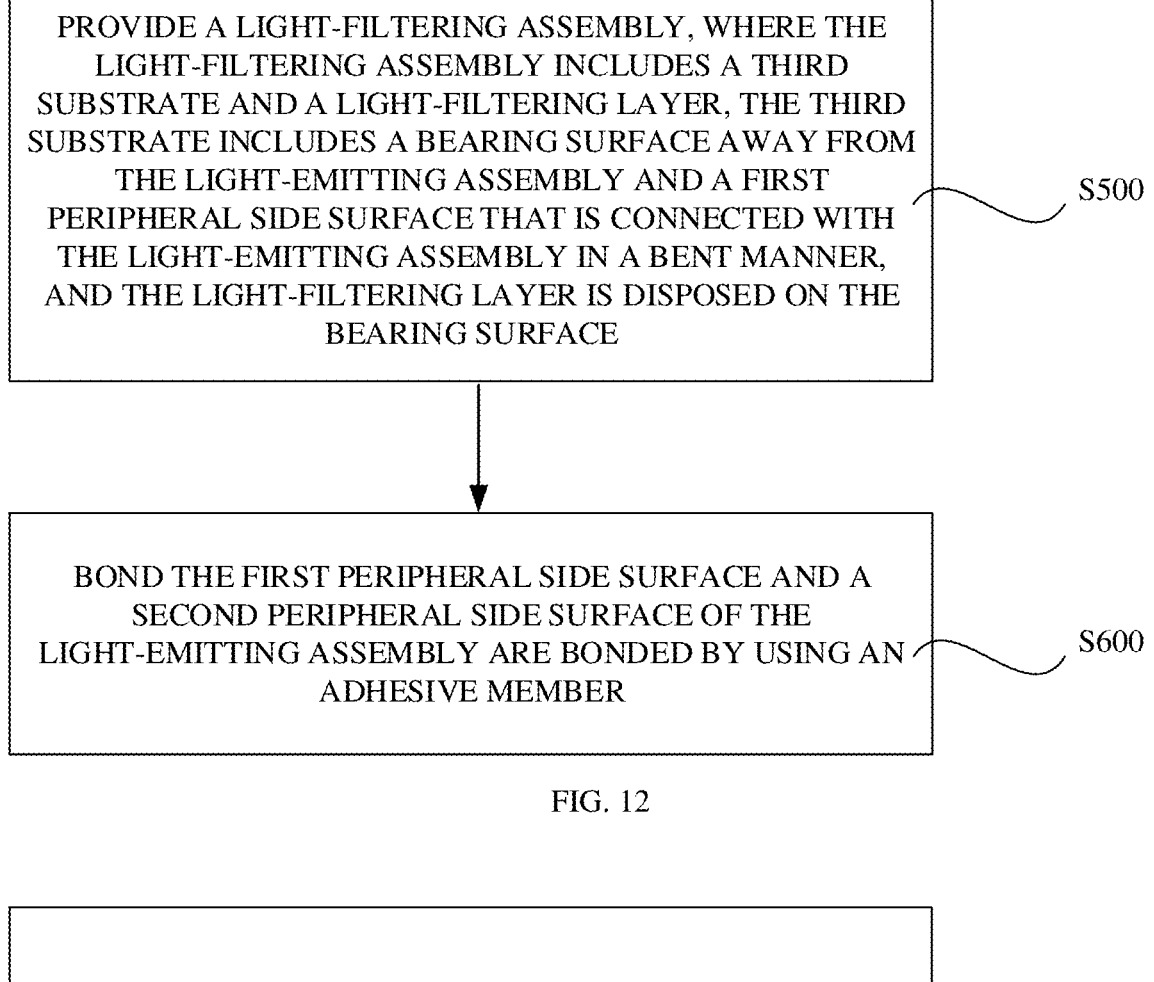

PROVIDE A LIGHT-FILTERING ASSEMBLY, WHERE THE LIGHT-FILTERING ASSEMBLY INCLUDES A THIRD SUBSTRATE AND A LIGHT-FILTERING LAYER, THE THIRD SUBSTRATE INCLUDES A BEARING SURFACE AWAY FROM THE LIGHT-EMITTING ASSEMBLY AND A FIRST PERIPHERAL SIDE SURFACE THAT IS CONNECTED WITH THE LIGHT-EMITTING ASSEMBLY IN A BENT MANNER, AND THE LIGHT-FILTERING LAYER IS DISPOSED ON THE BEARING SURFACE

S500

BOND THE FIRST PERIPHERAL SIDE SURFACE AND A SECOND PERIPHERAL SIDE SURFACE OF THE LIGHT-EMITTING ASSEMBLY ARE BONDED BY USING AN ADHESIVE MEMBER

DISPOSE A FIRST POSITIONING MEMBER ON THE DRIVING ASSEMBLY, AND DISPOSE ANOTHER FIRST POSITIONING MEMBER ON THE LIGHT-EMITTING ASSEMBLY

DISPOSE A POSITIONING MEMBER ON ONE SIDE OF THE LIGHT-FILTERING ASSEMBLY AWAY FROM THE DRIVING ASSEMBLY, AND DISPOSE ANOTHER POSITIONING MEMBER ON ONE SIDE OF THE LIGHT-EMITTING ASSEMBLY AWAY FROM THE DRIVING ASSEMBLY

DISPLAY PANEL AND DISPLAY SCREEN WITH A LIGHT-EMITTING ASSEMBLY AND A LIGHT-FILTERING ASSEMBLY

CROSS-REFERENCE TO RELATED APPLICATIONS

This application claims priority under 35 U.S.C. § 119(a) to Chinese Patent Application No. 202210642543.8, filed Jun. 8, 2022, the entire disclosure of which is incorporated herein by reference.

TECHNICAL FIELD

The disclosure relates to the field of display technology, and more particularly to a display panel, a display screen, and a manufacturing method of a display screen.

BACKGROUND

With development of photoelectric display technology and semiconductor manufacturing technology, displays equipped with Thin Film Transistors (TFT) have become more and more mature. For example, Thin Film Transistor Liquid Crystal Displays (TFT-LCD) and Thin Film Transistor Organic Light-Emitting Diode (TFT-OLED) displays have been successfully mass-produced. However, the latest mini LED displays and micro LED displays are regarded as a new direction of display revolutionary technology due to their advantages such as high brightness, high contrast, high color gamut, high resolution, fast response time, energy saving, and low power consumption.

In the related art, a process for manufacturing a mini LED display panel and a micro LED display panel is called mass transfer. Specifically, countless (millions, tens of millions, or hundreds of millions) LEDs are required to be transferred to a TFT array substrate, and electronically coupled with the TFT array substrate through wire bonding. However, through wire bonding, contact areas between wires and electrodes are small, and areas of connections between wires and TFTs are small, which is prone to cause poor display due to displacement. Therefore, large-sized display screens with mini LEDs and micro LEDs are difficult to be manufactured. How to improve manufacturing yield of mini LED display screens and micro LED display screens is a technical problem to-be-solved.

SUMMARY

In a first aspect, a display panel is provided in the disclosure. The display panel includes a light-emitting assembly, a driving assembly, multiple first conductive members, and multiple second conductive members. The light-emitting assembly includes multiple light-emitting units, where each of the multiple light-emitting units includes a first electrode and a second electrode spaced apart from the first electrode, and the first electrode surrounds the second electrode. The driving assembly includes multiple driving units, where one of the multiple driving units is disposed in correspondence with one of the multiple light-emitting units, and different driving units correspond to different light-emitting units. Each of the multiple driving units includes a third electrode and a fourth electrode spaced apart from the third electrode, and the third electrode surrounds the fourth electrode. Each of the multiple first conductive members couples the first electrode with the third electrode. Each of the multiple second conductive members couples the second electrode with the fourth electrode.

In a second aspect, a display screen is provided in the disclosure. The display screen includes the display panel of the first aspect and a housing. The housing is configured to carry the display panel.

In a third aspect, a manufacturing method of a display panel is provided in the disclosure. The method includes the following. A light-emitting assembly is provided, where the light-emitting assembly includes a first substrate and multiple light-emitting units disposed on the first substrate, and each of the multiple light-emitting units includes a first electrode and a second electrode spaced apart from the first electrode. A driving assembly is provided, where the driving assembly includes a second substrate and multiple driving units disposed on the second substrate, and each of the multiple driving units includes a third electrode and a fourth electrode spaced apart from the third electrode. A first conductive member is provided, where the first conductive member electronically couples the first electrode with the third electrode. A second conductive member is provided, where the second conductive member electronically couples the second electrode with the fourth electrode.

BRIEF DESCRIPTION OF THE DRAWINGS

To describe technical solutions in embodiments of the disclosure more clearly, the following will give a brief introduction to accompanying drawings required for describing embodiments. Apparently, the accompanying drawings hereinafter described are merely some embodiments of the disclosure. Based on these drawings, those of ordinary skill in the art can also obtain other drawings without creative effort.

FIG. 11 is a flow chart illustrating a manufacturing method of a display screen provided in implementations of the disclosure.

FIG. 12 is a flow chart illustrating a method after operations at S400 in the manufacturing method of a display screen provided in implementations of the disclosure.

FIG. 13 is a flow chart illustrating a method before operations at S300 in the manufacturing method of a display screen provided in implementations of the disclosure.

FIG. 14 is a flow chart illustrating a method before operations at S600 in the manufacturing method of a display screen provided in implementations of the disclosure.

Figure 1:
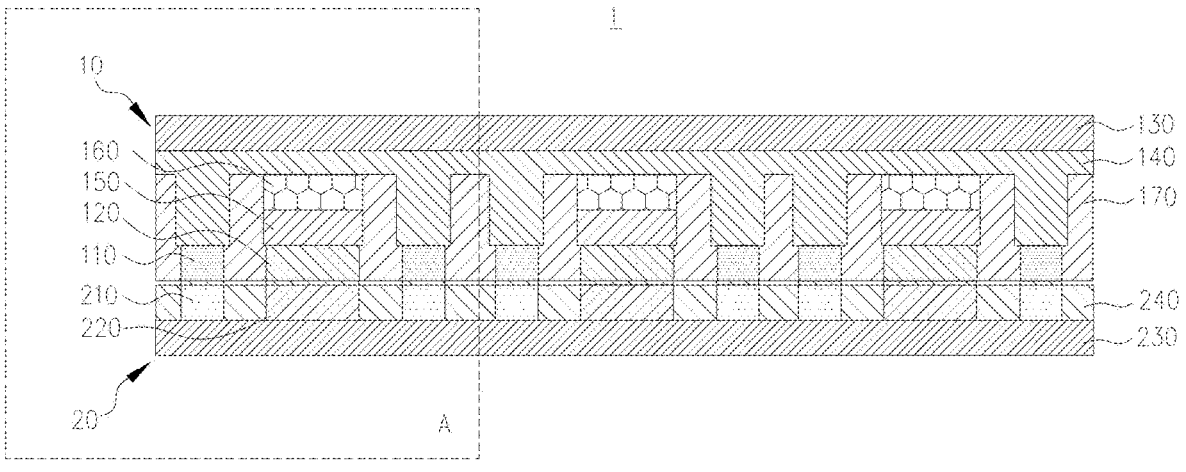
FIG. 1 is a schematic cross-sectional structural view illustrating a display panel provided in implementations of the disclosure.

Description of reference numbers: display screen—1000, display panel—1, light-emitting assembly—10, light-emitting unit—100, first electrode—110, second electrode—120, first substrate—130, first CTL—140, body part—141, bearing part—142, receiving groove—143, second CTL—150, light-emitting layer—160, first planarization layer—170, first through hole—171, second through hole—172, driving assembly—20, driving unit—200, third electrode—210, fourth electrode—220, second substrate—230, third planarization layer—240, first conductive member—30, second conductive member—40, light-filtering assembly—50, third substrate—51, bearing surface—511, first peripheral side surface—512, light-filtering layer—52, second peripheral side surface—521, second planarization layer—53, encapsulation layer—54, adhesive member—70.

DETAILED DESCRIPTION

The following will illustrate clearly and completely technical solutions of embodiments of the disclosure with reference to accompanying drawings of embodiments of the disclosure. Apparently, embodiments described herein are merely some embodiments, rather than all embodiments, of the disclosure. Based on the embodiments of the disclosure, all other embodiments obtained by those of ordinary skill in the art without creative effort shall fall within a protection scope of the disclosure.

The term "embodiment" or "implementation" referred to herein means that a particular feature, structure, or characteristic described in conjunction with embodiments or implementations may be contained in at least one embodiment of the disclosure. The phrase appearing in various places in the specification does not necessarily refer to the same embodiment, nor does it refer to an independent or alternative embodiment that is mutually exclusive with other embodiments. It is explicitly and implicitly understood by those skilled in the art that embodiments described herein may be combined with other embodiments.

It is to be noted that, the terms "first", "second", and the like used in the specification, the claims, and the accompany drawings of the disclosure are used to distinguish different objects rather than describe a particular order. The terms "include", "comprise", and "have" as well as variations thereof are intended to cover non-exclusive inclusion.

In the specification, for sake of convenience, words and phrases indicating directions or positional relationships, such as "center", "on", "under", "front", "back", "vertical", "horizontal", "top", "bottom", "in", "out", and the like are used to illustrate positional relationships of elements according to accompanying drawings and are only for the convenience of description of the specification and simplicity of description, rather than explicitly or implicitly indicate that apparatuses or components referred to herein must have a certain direction or be configured or operated in a certain direction and therefore cannot be understood as limitations to the disclosure. The positional relationships of elements can be appropriately changed according to directions of the illustrated elements. Therefore, the positional relationships are not limited to the words and phrases in the specification and can be appropriately changed according to situations.

In the specification, unless specified and limited otherwise, terms "installing", "coupling", "connecting", and the like referred to herein should be understood in broader sense. For example, coupling may be a fixed coupling, a removable coupling, or an integrated coupling, may be a mechanical coupling, an electronic coupling, and may be a direct coupling, an indirect coupling through a medium, or an interconnection between two components. For those of ordinary skill in the art, the above terms in the disclosure can be understood according to situations With development of photoelectric display technology and semiconductor manufacturing technology, displays equipped with Thin Film Transistors (TFT) have become more and more mature. For example, Thin Film Transistor Liquid Crystal Displays (TFT-LCD) and Thin Film Transistor Organic Light-Emitting Diode (TFT-OLED) displays have been successfully mass-produced. However, the latest mini LED displays and micro LED displays are regarded as a new direction of display revolutionary technology due to their advantages such as high brightness, high contrast, high color gamut, high resolution, fast response time, energy saving, and low power consumption.

In a process for manufacturing a mini LED display panel and a micro LED display panel, countless (millions, tens of millions, or hundreds of millions) LEDs are required to be transferred to a TFT array substrate, where the process is called mass transfer. However, it is prone to cause low manufacturing yield of the display panel due to immaturity of mass transfer technology.

Main reasons for immaturity of the mass transfer technology are the following. A basic structure of each LED from bottom to top includes a substrate, an n-type semiconductor (i.e., an Electron Transport Layer (ETL)), an electron-hole recombination layer, and a p-type semiconductor (i.e., a Hole Transport Layer (HTL)). The semiconductors are provided with metal electrodes and the metal electrodes are provided with wires, and the wires and the TFT array substrate are electronically coupled through wire bonding, thereby realizing electronic coupling between a TFT in the TFT array substrate and the LED. However, through wire bonding, contact areas between wires and electrodes are small, and areas of connections between wires and TFTs are small, which is prone to cause poor display due to displacement. Therefore, high-resolution and large-sized display screens for mini LEDs and micro LEDs are difficult to be prepared.

A display panel, a display screen, and a manufacturing method of a display screen are provided in the disclosure, which can improve manufacturing yield of mini LED displays and micro LED display screens.

Figure 2:
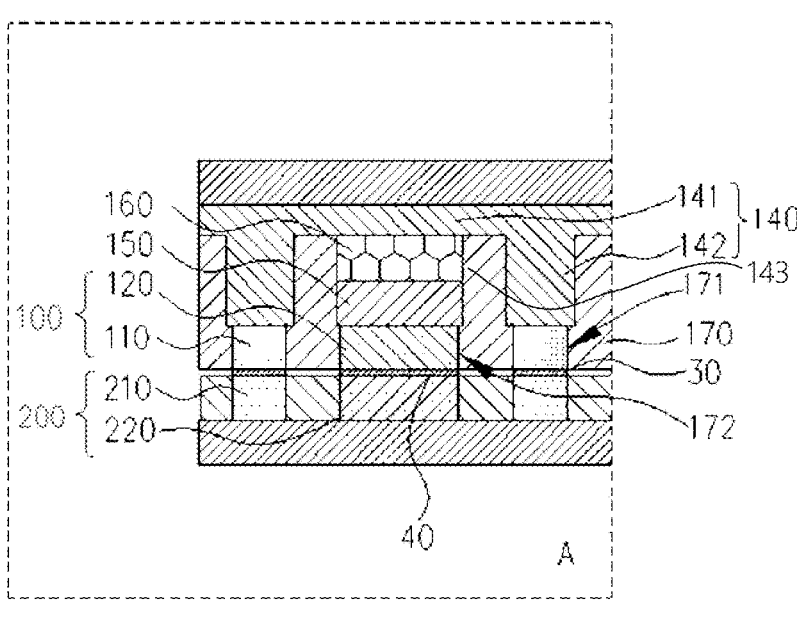
FIG. 2 is an enlarged schematic view illustrating region A in FIG. 1.

Referring to FIG. 1 and FIG. 2, FIG. 1 is a schematic cross-sectional structural view illustrating a display panel provided in implementations of the disclosure, and FIG. 2 is an enlarged schematic view illustrating region A in FIG. 1. A display panel 1 is provided in the disclosure. The display panel 1 includes a light-emitting assembly 10, a driving assembly 20, multiple first conductive members 30, and multiple second conductive members 40. The light-emitting assembly 10 includes multiple light-emitting units 100, where each of the multiple light-emitting units 100 includes a first electrode 110 and a second electrode 120 spaced apart from the first electrode 110. The first electrode 110 surrounds the second electrode 120. The driving assembly 20 includes multiple driving units 200, where one of the multiple driving units 200 is disposed in correspondence with one of the multiple light-emitting units 100, and different driving units 200 correspond to different light-emitting units 100. Each of the multiple driving units 200 includes a third electrode 210 and a fourth electrode 220 spaced apart from the third electrode 210. The third electrode 210 surrounds the fourth electrode 220. Each of the multiple first conductive members 30 couples the first electrode 110 with the third electrode 210. Each of the multiple second conductive members 40 couples the second electrode 120 with the fourth electrode 220.

In the implementation, the light-emitting assembly 10 includes, but is not limited to, a mini LED light-emitting assembly or a micro LED light-emitting assembly, which is not limited in the disclosure. A specific structure of the light-emitting assembly 10 will be illustrated in details later.

The driving assembly 20 is configured to drive the light-emitting assembly 10 to work. A specific structure of the driving assembly 20 will be illustrated in details later.

In the implementation, the first conductive member 30 is made of an adhesive with both an electrical conductivity and a bonding property. The first conductive member 30 mainly consists of resin matrix, a conductive particle and a dispersion additive, an auxiliary agent, etc. The resin matrix mainly includes epoxy resin, acrylate resin, polychlorinated ester, etc. The conductive particle may be a powder of Au, Ag, Cu, Al, Zn, Fe, or Ni, graphite, and/or some conductive compounds.

In other implementations, the first conductive member 30 can also be made of a conductive material with only an electrical conductivity. The first conductive member 30 bonds the first electrode 110 and the third electrode 210 through a conductive adhesive member, to realize electronic coupling between the first electrode 110 and the third electrode 210.

In other implementations, the first conductive member 30 can also be made of other soldering tin conductive materials. The first conductive member 30 is soldered between the first electrode 110 and the third electrode 210, to realize electronic coupling between the first electrode 110 and the third electrode 210, which is not limited herein.

In the implementation, the second conductive member 40 is made of an adhesive with both an electrical conductivity and a bonding property. The second conductive member 40 mainly consists of resin matrix, a conductive particle and a dispersion additive, an auxiliary agent, etc. The resin matrix mainly includes epoxy resin, acrylate resin, polychlorinated ester, etc. The conductive particle may be a powder of Au, Ag, Cu, Al, Zn, Fe, or Ni, graphite, and/or some conductive compounds.

In other implementations, the second conductive member 40 can also be made of a conductive material with only an electrical conductivity. The second conductive member 40 bonds the second electrode 120 and the fourth electrode 220 through a conductive adhesive member, to realize electronic coupling between the second electrode 120 and the fourth electrode 220.

In other implementations, the second conductive member 40 can also be made of other soldering tin conductive materials. The second conductive member 40 is soldered between the second electrode 120 and the fourth electrode 220, to realize electronic coupling between the second electrode 120 and the fourth electrode 220, which is not limited herein. It is to be noted that, the second conductive member 40 and the first conductive member 30 can be made of a same material or different materials.

The first electrode 110, the second electrode 120, the third electrode 210, and the fourth electrode 220 are made of a conductive material such as one or more of Au, Ag, Cu, and the like. The first electrode 110, the second electrode 120, the third electrode 210, and the fourth electrode 220 are made of a material including, but not limited to, a conductive metal or other conductive materials. In the implementation, the first electrode 110, the second electrode 120, the third electrode 210, and the fourth electrode 220 are made of a same material. In other implementations, the first electrode 110, the second electrode 120, the third electrode 210, and the fourth electrode 220 can also be made of different materials, which is not limited herein.

Figure 3:
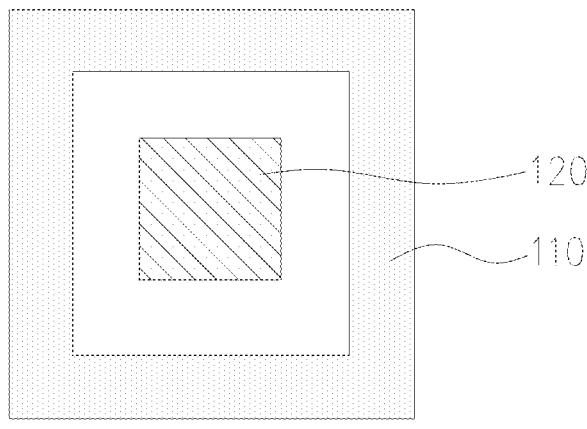
FIG. 3 is a schematic plane structural view illustrating a first electrode and a second electrode provided in implementations of the disclosure.

Referring to FIG. 3, FIG. 3 is a schematic plane structural view illustrating a first electrode and a second electrode provided in implementations of the disclosure. The first electrode 110 surrounds the second electrode 120.

Figure 4:
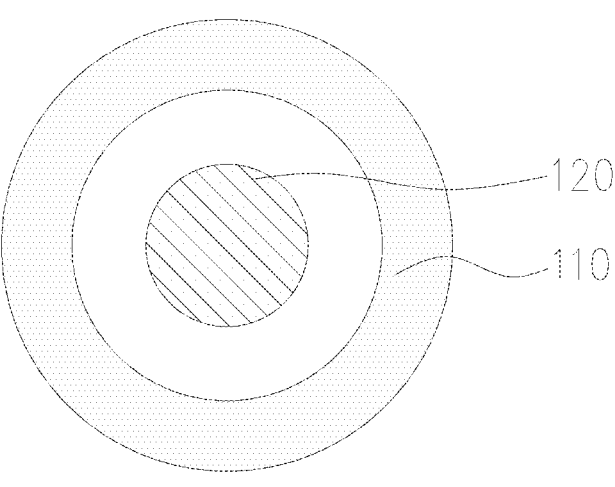
FIG. 4 is a schematic plane structural view illustrating a first electrode and a second electrode provided in implementations of the disclosure.

In the implementation, the second electrode 120 may be in a shape of a square, and the first electrode 110 surrounds the second electrode 120. In other implementations, the second electrode 120 may also be in other shapes, and the first electrode 110 surrounds the second electrode 120, which is not limited herein. For example, referring to FIG. 4, FIG. 4 is a schematic plane structural view illustrating a first electrode and a second electrode provided in implementations of the disclosure. The second electrode 120 is in a shape of a circle, and the first electrode 110 in a shape of a circular ring surrounds the second electrode 120.

Specifically, in the light-emitting unit 100, the first electrode 110 is spaced apart from the second electrode 120, which can avoid damage to the light-emitting unit 100 due to a short circuit of the light-emitting unit 100.

Figure 5:
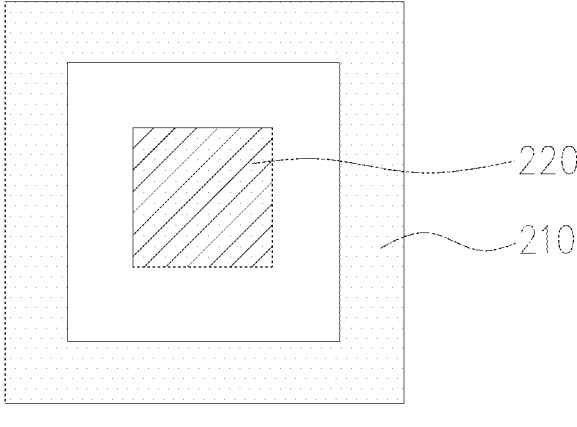
FIG. 5 is a schematic plane structural view illustrating a third electrode and a fourth electrode provided in implementations of the disclosure.
Figure 6:
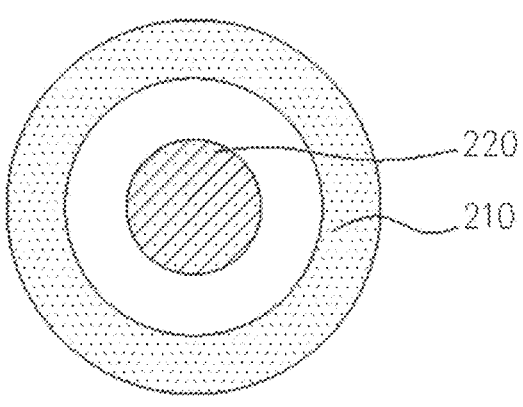
FIG. 6 is a schematic plane structural view illustrating a third electrode and a fourth electrode provided in implementations of the disclosure.
Figure 7:
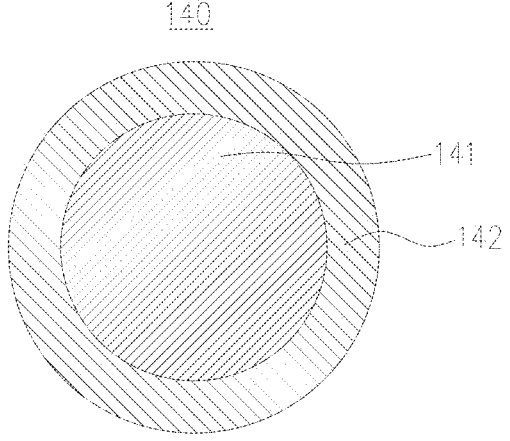
FIG. 7 is a schematic plane structural view illustrating a first Charge Transport Layer (CTL) provided in implementations of the disclosure.

Referring to FIG. 5 and FIG. 6, FIG. 5 is a schematic plane structural view illustrating a third electrode and a fourth electrode provided in implementations of the disclosure, and FIG. 6 is a schematic plane structural view illustrating a third electrode and a fourth electrode provided in implementations of the disclosure. It is to be noted that, the third electrode 210 of the driving assembly 20 corresponds to the first electrode 110 of the light-emitting assembly 10 in terms of shape, and the fourth electrode 220 of the driving assembly 20 corresponds to the second electrode 120 of the light-emitting assembly 10 in terms of shape. As a result, it is conducive to electronically coupling the driving assembly 20 with the light-emitting assembly 10, thereby improving a probability of coupling the driving assembly 20 with the light-emitting assembly 10, and thus improving manufacturing yield of the display panel 1.

Specifically, in the driving unit 200, the third electrode 210 is spaced apart from the fourth electrode 220, which can avoid damage to the driving unit 200 due to a short circuit of the driving unit 200.

It is to be noted that, in the implementation, the third electrode 210 of the driving unit 200 and the first electrode 110 of the light-emitting unit 100 are of a same type. The second electrode 120 of the light-emitting unit 100 and the fourth electrode 220 of the driving unit 200 are of a same type. Therefore, the first electrode 110 is required to be electronically coupled with the third electrode 210, and the second electrode 120 is required to be electronically coupled with the fourth electrode 220, such that the driving unit 200 can drive the light-emitting unit 100 to work.

In the implementation, the first electrode 110 is a positive electrode, the second electrode 120 is a negative electrode, the third electrode 210 is an anode, and the fourth electrode 220 is a cathode. In other implementations, the first electrode 110 may also be a negative electrode, the second electrode 120 may also be a positive electrode, the third electrode 210 may also be a cathode, and the fourth electrode 220 may also be an anode.

In the display panel 1 of the disclosure, the first electrode 110 of the light-emitting unit 100 in the light-emitting assembly 10 surrounds the second electrode 120, and therefore an area of the first electrode 110 can be larger. Even if relative displacement or misalignment occurs between the first conductive member 30 and the first electrode 110, the first conductive member 30 can still be electronically coupled with the first electrode 110 successfully. That is, in the display panel 1 provided in implementations of the disclosure, successful electronic coupling between the first electrode 110 and the first conductive member 30 has a greater probability. The third electrode 210 of the driving unit 200 in the driving assembly 20 surrounds the fourth electrode 220, and therefore an area of the third electrode 210 can be larger. Even if relative displacement or misalignment occurs between the first conductive member 30 and the third electrode 210, the first conductive member 30 can still be electronically coupled with the third electrode 210 successfully. That is, in the display panel 1 provided in implementations of the disclosure, successful electronic coupling between the third electrode 210 and the first conductive member 30 has a greater probability. As can be seen, in the display panel 1 provided in implementations of the disclosure, successful electronic coupling between the third electrode 210 and the first electrode 110 through the first conductive member 30 has a greater probability. Compared with a manner for electronically coupling the driving assembly 20 and the light-emitting assembly 10 in the related art, successful electronic coupling between the driving assembly 20 and the light-emitting assembly 10 in the disclosure has a greater probability. As such, it is conducive to improving manufacturing yield of the display panel 1, and thus improving manufacturing yield of mini LED display screens and micro LED display screens.

In the implementation, the light-emitting unit 100 includes, but is not limited to, a mini LED or a micro LED, which is not limited in the disclosure.

Referring to FIG. 1 to FIG. 7, FIG. 7 is a schematic plane structural view illustrating a first CTL provided in implementations of the disclosure. The light-emitting assembly 10 further includes a first substrate 130, a first CTL 140, a light-emitting layer 160, and a second CTL 150. The first CTL 140 is disposed on the first substrate 130. The first CTL 140 includes a body part 141 and a bearing part 142. The bearing part 142 surrounds a periphery of the body part 141 to define a receiving groove 143, and the first electrode 110 is disposed on the bearing part 142. The light-emitting layer 160 is disposed in the receiving groove 143 and spaced apart from the bearing part 142. The second CTL 150 is disposed on the light-emitting layer 160, where the second electrode 120 is disposed on the second CTL 150.

In the implementation, the first substrate 130 may be a flexible substrate. Optionally, the first substrate 130 may be made of any one or more of: Polymide (PI), Polyethylene Terephthalate (PET), Polyethylene Naphthalate Two Formic Acid Glycol Estr (PEN), Cyclo-olefinpolymer (COP), Poly-carbonate (PC), Polystyrene (PS), Polypropylene (PP), and Polytetrafluoroethylene (PTFE). In other implementation manners, the first substrate 130 may also be made of a non-flexible substrate such as glass or ceramics, which is not limited herein.

The first CTL 140 is configured to transport a first charge to the light-emitting layer 160. The second CTL 150 is configured to transport a second charge to the light-emitting layer 160. The first charge is an electron, and the second charge is a hole. Alternatively, the first charge is a hole, and the second charge is an electron.

In the light-emitting layer 160, the first charge transported to the light-emitting layer 160 via the first CTL 140 and the second charge transported to the light-emitting layer 160 via the second CTL 150 are recombined in the light-emitting layer 160, to make the light-emitting layer 160 emit lights. Therefore, the light-emitting layer 160 is also called an electron-hole recombination layer.

Specifically, the light-emitting layer 160 is disposed in the receiving groove 143 and on the body part 141. It is to be noted that, the bearing part 142 surrounds the periphery of the body part 141 to define the receiving groove 143, i.e., the bearing part 142 protrudes from the body part 141. The light-emitting layer 160 and the second CTL 150 are disposed on the body part 141, and also protrude from the body part 141. In the implementation, a sum of heights of the light-emitting layer 160 and the second CTL 150 is equal to a height of protrusion of the bearing part 142, such that the first electrode 110 and the second electrode 120 can be disposed on a same horizontal plane. Furthermore, the first electrode 110 has a same thickness as the second electrode 120. As such, it is conducive to electronically coupling the first electrode 110 with the third electrode 210 and electronically coupling the second electrode 120 with the fourth electrode 220, thereby simplifying a process of assembling the driving assembly 20 and the light-emitting assembly 10.

In other implementations, according to specifications and functions of the display panel 1, the sum of the heights of the light-emitting layer 160 and the second CTL 150 can also be adjusted to be unequal to the height of protrusion of the bearing part 142, and the first electrode 110 and the second electrode 120 can also be not disposed on a same horizontal plane, which is not limited herein.

Specifically, in the implementation, the first electrode 110 is a negative electrode, the second electrode 120 is a positive electrode, the first CTL 140 coupled with the first electrode 110 is an ETL, and the second CTL 150 coupled with the second electrode 120 is an HTL. In other implementations, the first electrode 110 may also be a positive electrode, the second electrode 120 may also be a negative electrode, the first CTL 140 coupled with the first electrode 110 may also be an HTL, and the second CTL 150 coupled with the second electrode 120 may also be an ETL.

It is to be noted that, the positive electrode is disposed in correspondence with the HTL, and the negative electrode is disposed in correspondence with the ETL.

The ETL is made of a material including, but not limited to, a semiconductor material such as Copper Phthalocyanine (CuPc), Titanium Oxide Phthalocyanine (TiOPc), etc. The HTL is made of a material including, but not limited to, a semiconductor material such as Tetraphenyl Phenylenedi-amine (TPD), N-Propyl Bromide (NPB), etc.

Referring to FIG. 1 and FIG. 2 again, the light-emitting assembly 10 further includes a first planarization layer 170, where the first planarization layer 170 covers the first CTL 140 and the second CTL 150 and defines a first through hole 171 and a second through hole 172. The first electrode 110 is coupled with the bearing part 142 of the first CTL 140 through the first through hole 171, and the second electrode 120 is coupled with the second CTL 150 through the second through hole 172.

Specifically, the first through hole 171 is in communication with the bearing part 142 of the first CTL 140, and the first electrode 110 is coupled with the bearing part 142 of the first CTL 140 through the first through hole 171. The second through hole 172 is in communication with the second CTL 150, and the second electrode 120 is coupled with the second CTL 150 through the second through hole 172.

It is to be noted that, correspondingly, the driving assembly 20 is provided with a third planarization layer 240 and the third planarization layer 240 defines a third through hole and a fourth through hole, and the third electrode 210 and the fourth electrode 220 of the driving assembly 20 are coupled with driving components of the driving assembly 20 through the third through hole and the fourth through hole respectively.

The light-emitting assembly 10 is provided with the first planarization layer 170, and the driving assembly 20 is provided with the third planarization layer 240. The first planarization layer 170 and the third planarization layer 240 can be used to encapsulate the light-emitting assembly 10 and the driving assembly 20, to isolate components in both the light-emitting assembly 10 and the driving assembly 20 from being contacted with external water vapor or oxygen, thereby preventing the light-emitting assembly 10 and the driving assembly 20 from being eroded by the external water vapor and oxidized by the oxygen. Furthermore, the first planarization layer 170 and the third planarization layer 240 can be used to flatten protruded electronic components in the light-emitting assembly 10 and the driving assembly 20, which is conducive to coupling the light-emitting assembly 10 with the driving assembly 20, thereby reducing a thickness of the display panel 1.

Referring to FIG. 3 again, an area of an orthographic projection of the first electrode 110 on the first substrate 130 is greater than an area of an orthographic projection of the second electrode 120 on the first substrate 130.

In the implementation, an area of the first electrode 110 is two times or approximately two times an area of the second electrode 120. In other words, a ratio of the area of the orthographic projection of the first electrode 110 on the first substrate 130 to the area of the orthographic projection of the second electrode 120 on the first substrate 130 is 2 or approximately equal to 2. Optionally, the ratio of the area of the orthographic projection of the first electrode 110 on the first substrate 130 to the area of the orthographic projection of the second electrode 120 on the first substrate 130 ranges from 1.5 to 3.5. For example, the ratio of the area of the orthographic projection of the first electrode 110 on the first substrate 130 to the area of the orthographic projection of the second electrode 120 on the first substrate 130 may be 1.5, 1.7, 2.0, 2.3, 2.5, 2.7, 3.0, 3.3, 3.5, or other values within 1.5 to 3.5.

Referring to FIG. 5 again, similarly, in the implementation, an area of the third electrode 210 is two times or approximately two times an area of the fourth electrode 220. In other words, a ratio of an area of an orthographic projection of the third electrode 210 on the first substrate 130 to an area of an orthographic projection of the fourth electrode 220 on the first substrate 130 is 2 or approximately equal to 2. Optionally, the ratio of the area of the ortho-graphic projection of the third electrode 210 on the first substrate 130 to the area of the orthographic projection of the fourth electrode 220 on the first substrate 130 ranges from 1.5 to 3.5. For example, the ratio of the area of the ortho-graphic projection of the third electrode 210 on the first substrate 130 to the area of the orthographic projection of the fourth electrode 220 on the first substrate 130 may be 1.5, 1.7, 2.0, 2.3, 2.5, 2.7, 3.0, 3.3, 3.5, or other values within 1.5 to 3.5.

Referring to FIG. 1 and FIG. 2 again, one of the third electrode 210 and the fourth electrode 220 is an anode, the other is a cathode. The driving assembly 20 further includes a second substrate 230, the driving unit 200 is disposed on the second substrate 230 and further includes a TFT (not illustrated in figures), and the anode is electronically coupled with a drain of the TFT.

Specifically, if the first electrode 110 is a positive elec-trode and the second electrode 120 is a negative electrode, the third electrode 210 corresponding to the first electrode 110 is an anode, and the fourth electrode 220 corresponding to the second electrode 120 is a cathode. If the first electrode 110 is a negative electrode and the second electrode 120 is a positive electrode, the third electrode 210 corresponding to the first electrode 110 is a cathode, and the fourth electrode 220 corresponding to the second electrode 120 is an anode.

In the implementation, the second substrate 230 may be a flexible substrate. Optionally, the second substrate 230 may be made of any one or more of: PI, PET, PEN, COP, PC, PS, PP, and PTFE. In other implementation manners, the second substrate 230 may also be made of a non-flexible substrate such as glass or ceramics, which is not limited herein. The first substrate 130 and the second substrate 230 can be made of a same material or different materials.

A display screen is provided in the disclosure. The display screen includes the display panel 1 and a housing 2. The housing 2 is configured to carry the display panel 1. The housing 2 can be used to protect the display panel 1, to prevent the display panel 1 from being damaged by external objects.

Figure 8:
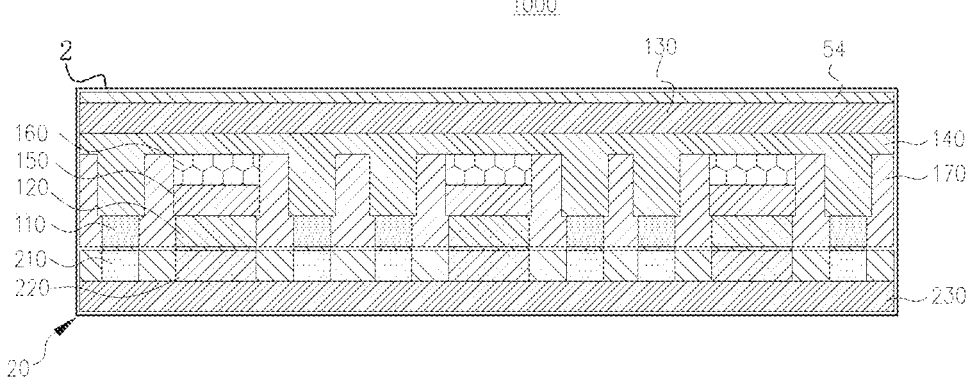
FIG. 8 is a schematic cross-sectional structural view illustrating a display screen provided in implementations of the disclosure.

Referring to FIG. 8, FIG. 8 is a schematic cross-sectional structural view illustrating a display screen provided in implementations of the disclosure. The multiple light-emit-ting units 100 are configured to emit red lights, green lights, and blue lights. The display screen further includes an encapsulation layer 54, where the encapsulation layer 54 is disposed on one side of the light-emitting assembly 10 away from the driving assembly 20.

Specifically, the light-emitting units 100 are different red-green-blue (RGB) light-emitting units, and the multiple RGB light-emitting units are arranged in an array in advance. The light-emitting units include R light-emitting units, G light-emitting units, and B light-emitting units. The R light-emitting units are configured to emit red lights, the G light-emitting units are configured to emit green lights, and the B light-emitting units are configured to emit blue lights.

The encapsulation layer 54 can be used to encapsulate the light-emitting assembly 10, to isolate the light-emitting assembly 10 from being contacted with external water vapor or oxygen, thereby preventing the light-emitting assembly 10 from being eroded by the external water vapor and oxidized by the oxygen, and thus improving a service life of the display panel 1 and the display screen 1000.

Figure 9:
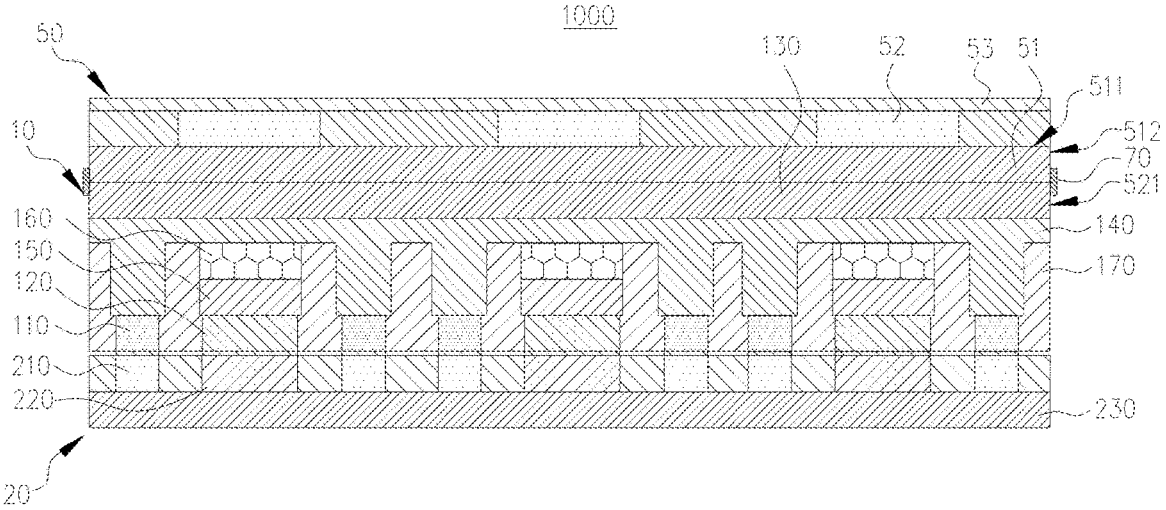
FIG. 9 is a schematic cross-sectional structural view illustrating a display screen provided in implementations of the disclosure.

Referring to FIG. 9, FIG. 9 is a schematic cross-sectional structural view illustrating a display screen provided in implementations of the disclosure. In the above implemen-tation, the multiple light-emitting units 100 are configured to emit red lights, green lights, and blue lights. In another implementation, the multiple light-emitting units 100 are configured to emit white lights.

The display screen 1000 further includes a light-filtering assembly 50. The light-filtering assembly 50 is disposed on the light-emitting assembly 10 and configured to filter lights emitted by the light-emitting assembly 10.

The light-filtering assembly 50 can filter passed lights. Specifically, the light-filtering assembly 50 can reflect some lights that affect a display effect of the display screen 1000, thereby improving the display effect of the display screen 1000.

It is to be noted that, if the multiple light-emitting units 100 are different RGB light-emitting units, the display screen 1000 can also have the light-filtering assembly 50, which is not limited herein.

Referring to FIG. 9 again, the light-filtering assembly 50 includes a third substrate 51 and a light-filtering layer 52. The third substrate 51 includes a bearing surface 511 away from the light-emitting assembly 10 and a first peripheral side surface 512 that is connected with the light-emitting assembly 10. The light-filtering layer 52 is disposed on the bearing surface 511.

The display screen 1000 further includes an adhesive member 70. The adhesive member 70 bonds the first peripheral side surface 512 and a second peripheral side surface 521 of the light-emitting assembly 10.

Specifically, the adhesive member 70 bonds the first peripheral side surface 512 and the second peripheral side surface 521 of the first substrate 130 in the light-emitting assembly 10.

Specifically, the light-filtering layer 52 includes multiple light-filtering units. Each of the multiple light-filtering units is disposed in correspondence with one of the multiple light-emitting units 100, and different light-filtering units correspond to different light-emitting units 100.

Compared with front bonding (i.e., bonding from the front), in the disclosure, side bonding (bonding from the side) of the light-filtering assembly 50 and the light-emitting assembly 10 can reduce or even eliminate a gap between the light-filtering assembly 50 and the light-emitting assembly 10, thereby reducing a thickness of the display screen 1000.

In the implementation, the third substrate 51 may be a flexible substrate. Optionally, the third substrate 51 may be made of any one or more of: PI, PET, PEN, COP, PC, PS, PP, and PTFE. In other implementation manners, the third substrate 51 may also be made of a non-flexible substrate such as glass or ceramics, which is not limited herein. The first substrate 130, the second substrate 230, and the third substrate 51 can be made of a same material or different materials.

Figure 10:
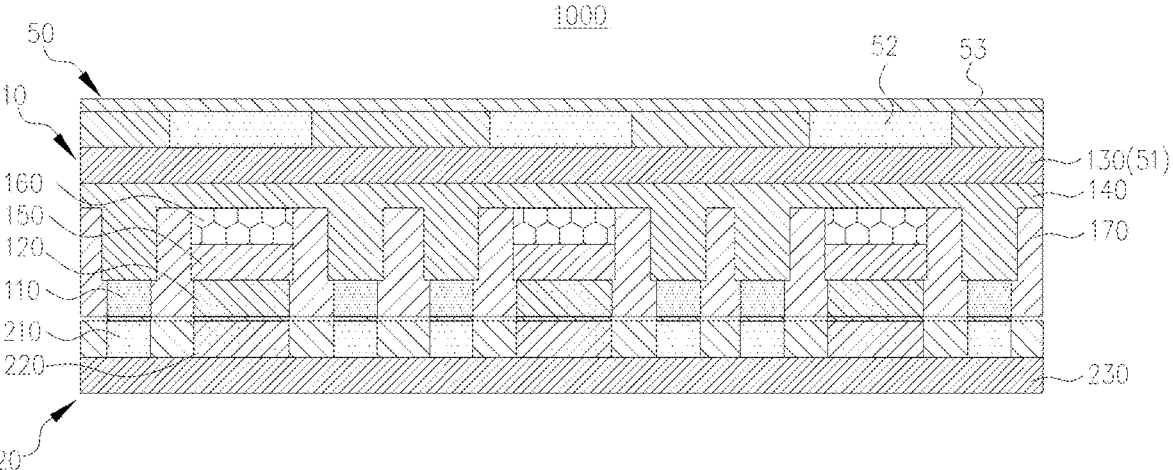
FIG. 10 is a schematic cross-sectional structural view illustrating a display screen provided in implementations of the disclosure.

In the implementation, the third substrate 51 of the light-filtering assembly 50 is bonded with the first substrate 130 of the light-emitting assembly 10, such that the light-emitting assembly 10 is coupled with the light-filtering assembly 50. In other implementations, as illustrated in FIG. 10, FIG. 10 is a schematic cross-sectional structural view illustrating a display screen provided in implementations of the disclosure. The third substrate 51 of the light-filtering assembly 50 and the first substrate 130 of the light-emitting assembly 10 can also be a same substrate, which is not limited herein.

Referring to FIG. 9 again, the light-filtering assembly 50 further includes a second planarization layer 53. The second planarization layer 53 is disposed on one side of the light-filtering layer 52 away from the bearing surface 511.

The second planarization layer 53 can be configured to flatten the light-filtering layer 52, to make a surface of the display screen 1000 more smooth.

In addition, the second planarization layer 53 is further configured to protect the light-filtering layer 52, to prevent the light-filtering layer 52 from being damaged.

A manufacturing method of a display panel 1000 is further provided in the disclosure. The manufacturing method of the display panel 1000 can be used to manufacture the display screen 1000 provided in implementations of the disclosure. Correspondingly, the display screen 1000 provided in implementations of the disclosure can be manufactured with the manufacturing method of the display panel 1000 provided in implementations of the disclosure.

Referring to FIG. 11, FIG. 11 is a flow chart illustrating a manufacturing method of a display screen 1000 provided in implementations of the disclosure. The manufacturing method of the display screen 1000 includes, but is not limited to, operations at S100, S200, S300, and S400, where the operations at S100, S200, S300, and S400 will be illustrated in details as follows.

At S100, a light-emitting assembly 10 is provided, where the light-emitting assembly 10 includes a first substrate 130 and multiple light-emitting units 100 disposed on the first substrate 130, and each of the multiple light-emitting units 100 includes a first electrode 110 and a second electrode 120 spaced apart from the first electrode 110.

At S200, a driving assembly 20 is provided, where the driving assembly 20 includes a second substrate 230 and multiple driving units 200 disposed on the second substrate 230, and each of the multiple driving units 200 includes a third electrode 210 and a fourth electrode 220 spaced apart from the third electrode 210.

At S300, a first conductive member 30 is provided, where the first conductive member 30 electronically couples the first electrode 110 with the third electrode 210.

At S400, a second conductive member 40 is provided, where the second conductive member 40 electronically couples the second electrode 120 with the fourth electrode 220.

Specifically, the light-emitting assembly 10 is disposed on the driving assembly 20, and one of the multiple light-emitting units 100 corresponds to one of the multiple driving units 200. The first electrode 110 of each of the multiple light-emitting units 100 is electronically coupled with the third electrode 210 of each of the multiple driving units 200 through the first conductive member 30. The second electrode 120 of each of the multiple light-emitting units 100 is electronically coupled with the fourth electrode 220 of each of the multiple driving units 200 through the second conductive member 40.

In the display panel 1 of the disclosure, the first electrode 110 of the light-emitting unit 100 in the light-emitting assembly 10 surrounds the second electrode 120, and therefore an area of the first electrode 110 can be larger. Even if relative displacement or misalignment occurs between the first conductive member 30 and the first electrode 110, the first conductive member 30 can still be electronically coupled with the first electrode 110 successfully. That is, in the display panel 1 provided in implementations of the disclosure, successful electronic coupling between the first electrode 110 and the first conductive member 30 has a greater probability. The third electrode 210 of the driving unit 200 in the driving assembly 20 surrounds the fourth electrode 220, and therefore an area of the third electrode 210 can be larger. Even if relative displacement or misalignment occurs between the first conductive member 30 and the third electrode 210, the first conductive member 30 can still be electronically coupled with the third electrode 210 successfully. That is, in the display panel 1 provided in implementations of the disclosure, successful electronic coupling between the third electrode 210 and the first conductive member 30 has a greater probability. As can be seen, in the display panel 1 provided in implementations of the disclosure, successful electronic coupling between the third electrode 210 and the first electrode 110 through the first conductive member 30 has a greater probability. Compared with a manner for electronically coupling the driving assembly 20 and the light-emitting assembly 10 in the related art, the driving assembly 20 is more likely to be successfully electronically coupled with the light-emitting assembly 10 in the disclosure. As such, it is conducive to improving manufacturing yield of the display panel 1, and thus improving manufacturing yield of mini LED display screens and micro LED display screens.

Furthermore, in an implementation, the light-emitting units 100 are different RGB light-emitting units, and the multiple RGB light-emitting units are arranged in an array in advance. In the related art, in mass transfer of wafers, R light-emitting units, G light-emitting units, and B light-emitting units are prone to be transferred disorderly. However, the display panel 1 and the display screen 1000 provided in the disclosure do not need to be manufactured through mass transfer, which can greatly improve manufacturing yield of the display screen 1000.

In a manufacturing method of the display screen 1000 in the related art, generally, light-emitting units (wafers) are formed on a sapphire substrate, the light-emitting units (wafers) are peeled off from the sapphire substrate, and the light-emitting units (wafers) are bonded with a driving assembly through mass transfer. In the manufacturing method of the display screen 1000 in the disclosure, the light-emitting assembly 10 with the multiple light-emitting units 100 is formed at first, and the whole light-emitting assembly 10 is electronically coupled with the driving assembly 20. Compared with the method in the related art where the multiple light-emitting units 100 need to be separately transferred to the driving assembly 20, the manufacturing method of the display screen 1000 in the disclosure can improve a yield of manufacturing the display screen 1000.

Referring to FIG. 12, FIG. 12 is a flow chart illustrating a method after operations at S400 in the manufacturing method of a display screen provided in implementations of the disclosure. The manufacturing method of the display screen 1000 further includes the following.

At S500, a light-filtering assembly 50 is provided. The light-filtering assembly 50 includes a third substrate 51 and a light-filtering layer 52, the third substrate 51 includes a bearing surface 511 away from the light-emitting assembly 10 and a first peripheral side surface 512 that is connected with the light-emitting assembly 10 in a bent manner, and the light-filtering layer 52 is disposed on the bearing surface 511.

At S600, the first peripheral side surface 512 and a second peripheral side surface 521 of the light-emitting assembly 10 are bonded by using an adhesive member 70.

Referring to FIG. 13, FIG. 13 is a flow chart illustrating a method before operations at S300 in the manufacturing method of a display screen provided in implementations of the disclosure. It is to be noted that, before the operations at S300 that "the first conductive member 30 is provided, where the first conductive member 30 electronically couples the first electrode 110 with the third electrode 210", the method further includes the following.

At S210, a first positioning member is disposed on the driving assembly 20, and another first positioning member is disposed on the light-emitting assembly 10.

As such, each driving unit 200 in the driving assembly 20 corresponds to each light-emitting unit 100 in the light-emitting assembly 10.

Before the operations at S600 that "the first peripheral side surface 512 and the second peripheral side surface 521 of the light-emitting assembly 10 are bonded by using the adhesive member 70", the method further includes the following.

Referring to FIG. 14, FIG. 14 is a flow chart illustrating a method before operations at S600 in the manufacturing method of a display screen provided in implementations of the disclosure.

At S510, a positioning member is disposed on one side of the light-filtering assembly 50 away from the driving assembly 20, and another positioning member is disposed on one side of the light-emitting assembly 10 away from the driving assembly 20.

As such, each light-filtering unit in the light-filtering assembly 50 corresponds to each light-emitting unit 100 in the light-emitting assembly 10.

The above are some implementations of the disclosure. It should be pointed out that, those of ordinary skill in the technical field can still make some improvements and embellishments without departing from the principles of the disclosure, and the improvements and embellishments are also regarded within the protection scope of the disclosure.

What is claimed is:

1. A display panel, comprising:
a light-emitting assembly comprising a plurality of light-emitting units, wherein
the plurality of light-emitting units are configured to emit red lights, green lights, and blue lights, or the plurality of light-emitting units are configured to emit white lights, and
each of the plurality of light-emitting units comprises a first electrode and a second electrode spaced apart from the first electrode, and the first electrode surrounds the second electrode;
a driving assembly comprising a plurality of driving units, wherein one of the plurality of driving units is disposed in correspondence with one of the plurality of light-emitting units, different driving units correspond to different light-emitting units, each of the plurality of driving units comprises a third electrode and a fourth electrode spaced apart from the third electrode, and the third electrode surrounds the fourth electrode;
a plurality of first conductive members, wherein each of the plurality of first conductive members couples the first electrode with the third electrode;
a plurality of second conductive members, wherein each of the plurality of second conductive members couples the second electrode with the fourth electrode;
a light-filtering assembly, wherein the light-filtering assembly is disposed on the light-emitting assembly and configured to filter lights emitted by the light-emitting assembly, and the light-filtering assembly comprises a substrate and a light-filtering layer, wherein the substrate of the light-filtering assembly comprises a bearing surface away from the light-emitting assembly and a first peripheral side surface that is connected with the light-emitting assembly, and the light-filtering layer is disposed on the bearing surface; and
an adhesive member bonding the first peripheral side surface and a second peripheral side surface of the light-emitting assembly.

2. The display panel of claim 1, wherein the driving assembly further comprises a planarization layer and the planarization layer is configured to encapsulate the driving assembly.

3. The display panel of claim 1, wherein one of the third electrode and the fourth electrode is an anode, the other is a cathode, the driving assembly further comprises a substrate, each of the plurality of driving units is disposed on the substrate of the driving assembly and further comprises a Thin Film Transistor (TFT), and the anode is electronically coupled with a drain of the TFT.

4. The display panel of claim 1, wherein the light-emitting assembly further comprises:

a substrate;

a first Charge Transport Layer (CTL) disposed on the substrate of the light-emitting assembly and comprising a body part and a bearing part, wherein the bearing part surrounds a periphery of the body part to define a receiving groove, and the first electrode is disposed on the bearing part;

a light-emitting layer disposed in the receiving groove and spaced apart from the bearing part; and a second CTL disposed on the light-emitting layer, wherein the second electrode is disposed on the second CTL, and wherein the first electrode is a negative electrode, the second electrode is a positive electrode, the first CTL is an Electron Transport Layer (ETL), and the second CTL is a Hole Transport Layer (HTL), or the first electrode is a positive electrode, the second electrode is a negative electrode, the first CTL is an HTL, and the second CTL is an ETL.

5. The display panel of claim 4, wherein the first CTL is configured to transport a first charge to the light-emitting layer, and the second CTL is configured to transport a second charge to the light-emitting layer.

6. The display panel of claim 4, wherein an area of an orthographic projection of the first electrode on the substrate of the light-emitting assembly is greater than an area of an orthographic projection of the second electrode on the substrate of the light-emitting assembly.

7. The display panel of claim 4, wherein an area of an orthographic projection of the third electrode on the substrate of the light-emitting assembly is greater than an area of an orthographic projection of the fourth electrode on the substrate of the light-emitting assembly.

8. The display panel of claim 4, wherein the light-emitting assembly further comprises a planarization layer, wherein the planarization layer covers the first CTL and the second CTL and defines a first through hole and a second through hole, and wherein the first electrode is coupled with the bearing part of the first CTL through the first through hole, and the second electrode is coupled with the second CTL through the second through hole.

9. A display screen, comprising a display panel, and a housing configured to carry the display panel, wherein the display panel comprises:

a light-emitting assembly comprising a plurality of light-emitting units, wherein the plurality of light-emitting units are configured to emit red lights, green lights, and blue lights, or the plurality of light-emitting units are configured to emit white lights, and each of the plurality of light-emitting units comprises a first electrode and a second electrode spaced apart from the first electrode, and the first electrode surrounds the second electrode;

a driving assembly comprising a plurality of driving units, wherein one of the plurality of driving units is disposed in correspondence with one of the plurality of light-emitting units, different driving units correspond to different light-emitting units, each of the plurality of driving units comprises a third electrode and a fourth electrode spaced apart from the third electrode, and the third electrode surrounds the fourth electrode;

a plurality of first conductive members, wherein each of the plurality of first conductive members couples the first electrode with the third electrode;

a plurality of second conductive members, wherein each of the plurality of second conductive members couples the second electrode with the fourth electrode;

a light-filtering assembly, wherein the light-filtering assembly is disposed on the light-emitting assembly and configured to filter lights emitted by the light-emitting assembly, and the light-filtering assembly comprises a substrate and a light-filtering layer, wherein the substrate of the light-filtering assembly comprises a bearing surface away from the light-emitting assembly and a first peripheral side surface that is connected with the light-emitting assembly, and the light-filtering layer is disposed on the bearing surface; and an adhesive member bonding the first peripheral side surface and a second peripheral side surface of the light-emitting assembly.

10. The display screen of claim 9, wherein the light-filtering layer comprises a plurality of light-filtering units, wherein one of the plurality of light-filtering units is disposed in correspondence with one of the plurality of light-emitting units and different light-filtering units correspond to different light-emitting units.

11. The display screen of claim 9, wherein the light-filtering assembly further comprises a planarization layer, wherein the planarization layer is disposed on one side of the light-filtering layer away from the bearing surface and is configured to flatten the light-filtering layer.

12. The display screen of claim 9, wherein one of the third electrode and the fourth electrode is an anode, the other is a cathode, the driving assembly further comprises a substrate, each of the plurality of driving units is disposed on the substrate of the driving assembly and further comprises a Thin Film Transistor (TFT), and the anode is electronically coupled with a drain of the TFT.

13. The display screen of claim 9, wherein the light-emitting assembly further comprises:

a substrate;

a first Charge Transport Layer (CTL) disposed on the substrate of the light-emitting assembly and comprising a body part and a bearing part, wherein the bearing part surrounds a periphery of the body part to define a receiving groove, and the first electrode is disposed on the bearing part;

a light-emitting layer disposed in the receiving groove and spaced apart from the bearing part; and a second CTL disposed on the light-emitting layer, wherein the second electrode is disposed on the second CTL, and wherein the first electrode is a negative electrode, the second electrode is a positive electrode, the first CTL is an Electron Transport Layer (ETL), and the second CTL is a Hole Transport Layer (HTL), or the first electrode is a positive electrode, the second electrode is a negative electrode, the first CTL is an HTL, and the second CTL is an ETL.

14. The display screen of claim 13, wherein an area of an orthographic projection of the first electrode on the substrate of the light-emitting assembly is greater than an area of an orthographic projection of the second electrode on the substrate of the light-emitting assembly.

* * * * *